United States Patent [19]

Granz et al.

[11] Patent Number: 4,661,814

[45] Date of Patent: Apr. 28, 1987

[54] DEVICE FOR READING OUT A TWO-DIMENSIONAL CHARGE PATTERN BY MEANS OF AN ARRAY

[75] Inventors: Bernd Granz, Oberasbach; Ralph Oppelt, Memmelsdorf; Bertram Sachs, Erlangen, all of Fed. Rep. of Germany

[73] Assignee: Siemens Aktiengesellschaft, Berlin and Munich, Fed. Rep. of Germany

[21] Appl. No.: 716,904

[22] Filed: Mar. 28, 1985

[30] Foreign Application Priority Data

Apr. 4, 1984 [DE] Fed. Rep. of Germany ....... 3412665

[51] Int. Cl.$^4$ .......................... H04Q 9/00; H04N 3/15
[52] U.S. Cl. ................. 340/825.79; 358/213; 250/578
[58] Field of Search ................... 340/825.79; 358/213, 358/241; 250/578

[56] References Cited

U.S. PATENT DOCUMENTS 4,477,835 10/1984 Berger et al. ...................... 358/213
4,581,539 4/1986 Kimata ............................... 358/213
4,592,029 5/1986 Altman et al. ...................... 358/213

FOREIGN PATENT DOCUMENTS 3224026 12/1983 Fed. Rep. of Germany .

OTHER PUBLICATIONS

Article, "State-of-the-Art in Two-Dimensional Ultrasonic Transducer Array Technology", by Maginness et al. in Medical Physics, vol. 3, No. 5, pp. 312-318 (1976).

Primary Examiner—Donald J. Yusko
Attorney, Agent, or Firm—Mark H. Jay

[57] ABSTRACT

A device for reading out two-dimensional charge patterns contains a receiver matrix (consisting of elementary transducers arranged in rows and columns) and a switching matrix (consisting of a carrier plate and electronic components in chip form) which are arranged on the long side of the carrier plate which faces away from the receiver matrix. A switchable amplifier in chip form is assigned to each of the elementary transducers connecting lines of at least approximately the same length are provided between contact lips and the corresponding switchable amplifiers, and signal output lines and ground lines run parallel to one another, while control lines run perpendicular to them. This design of the switching matrix makes the device unusually simple in its construction, with the amplifiers that are arranged on the long side of the carrier plate, which faces away from the receiver matrix, always being accessible, even after the device has been assembled. Thus, when individual image points drop out, the corresponding amplifiers can be replaced quickly and easily.

15 Claims, 2 Drawing Figures

DEVICE FOR READING OUT A TWO-DIMENSIONAL CHARGE PATTERN BY MEANS OF AN ARRAY

BACKGROUND OF THE INVENTION

The invention concerns a device for reading out two-dimensional charge pattern by means of an array that includes a receiver matrix (consisting of elementary transducers arranged in rows and columns) and a switching matrix (consisting of a carrier plate and electronic components in chip form) which are arranged on the long side of the carrier plate facing away from the receiver matrix.

A device for reading out a two-dimensional charge pattern with an array that contains stacked circuit boards is already known. Each of these stacked circuit boards is provided on its narrow side with electrodes, and on its long side with switchable amplifiers. A leak resistance is connected to each of these amplifiers. One flat side of each of these circuit boards is provided with a recess running parallel to the narrow side. In this device, a switchable amplifier, for example, a dual-gate MOSFET, is assigned to each of the electrodes of the circuit boards. These amplifiers are arranged along the length of the recess. The connecting lines between the electrodes and the respective switchable amplifiers are at least approximately the same length. The main control lines are arranged on the narrow sides of the circuit boards, opposite to the electrodes, in the direction of the columns, which, in each case, electrically connect those control wires of the switchable amplifiers of the circuit boards that belong to the same column, with one another (DE-OS No. 332 24 026).

In this device, the switchable amplifiers are perpendicular to the image level. After the device has been assembled, these switchable amplifiers are no longer accessible. If a line drops out, the corresponding circuit board can be replaced, since each of the circuit boards forms one line of the matrix. However, this removal necessitates a disassembly of the device. In addition, a circuit board must be changed even if only a few image points have dropped out in the line in question.

Another device uses an array for reading out a two-dimensional ultrasonic image. This array contains an ultrasonic receiver matrix, consisting of elementary transducers arranged in rows and columns, and a switching matrix consisting of a mounting board and a number of electronic components in chip form, which are arranged on the long side facing away from the elementary transducers. The mounting board is made of etchable glass. In each chip, five double-diffused metal-oxide semconductors (DMOS) are combined and bonded to the glass substrate. The elementary converters are connected to the corresponding chips with connecting lines. This device has an ultrasonic receiver matrix that contains 10×10 elementary transducers (M.G. Maginnes, J. D. Plummer, W. L. Beaver, J. D. Meindl; Medical Physics, Vol. 3, No. 5, Sept./Oct. 1976, pages 312 to 318).

In this device the connecting lines are of different lengths. Since the capacity of small elementary transducers is always very low, the connecting lines between the elementary transducers and the corresponding DMOS must be short in each case, to avoid losses. Furthermore, in this device, the DMOS operate only as switches and not as amplifiers. In addition, as a result of the difference in the lengths of the connecting wires, no homogenous signal amplification is obtained.

One object of the invention is to simplify construction in such a manner that when individual image points disappear, this failure can be eliminated by replacing individual amplifier chips, without having to disassemble the device.

A further object is to ensure that all the connecting lines from the elementary transducers to the inputs of the respective amplifier chips are at least approximately the same length.

Another object is to provide a device which can be inexpensively manufactured.

Still another object is to generally improve on prior art devices.

SUMMARY OF THE INVENTION

According to the invention, an amplifier chip is assigned to each of the elementary transducers. The chips are arranged in rows and columns on a long side of a switching matrix, facing away from the receiver matrix. Electrodes are arranged on the long side of the switching matrix. The electrodes are connected, for example with the aid of conductive material which coats the surface of a hole, with a respective contact lip on the other long side of the switching matrix. The signals from the elementary transducers pass through a d.c. or capacitive coupling to the electrodes of the switching matrix. Each of the contact lips is connected with an input of the respective amplifier chip. A dual-gate MOSFET is one example of a possible amplifier. In addition, a leak resistance is integrated in each amplifier chip. By designing the switching matrix this way, it is possible to obtain a device with an unusually simple construction for the readout of a two-dimensional charge pattern. Since the receiver matrix and the switching matrix can be separated mechanically, the receiver matrix and the switching matrix can be mutually exchanged. The amplifier chips that are mounted on the long side facing away from the receiver matrix are always easily accessible, even after the device has been assembled. When individual image points disappear, the corresponding amplifier chips can thus be quickly and easily exchanged, without taking the device apart. In addition, because each of the amplifier chips is assigned to one of the elementary converters, all the connecting lines are the same (or almost the same) length and are as short as possible. By this means, the signal loss and the interference effects are substantially reduced and a homogenous signal amplification is obtained over the entire image plane. An especially advantageous refinement of the device is achieved by having the receiver matrix contain a layer that is sensitive to ultrasonic waves—for example, a film made of polyvinylidene fluoride (PVDF), and several right-angled rods, each of which is provided with electrodes. The rods form a hard backing for the layer that is sensitive to ultrasonic waves. The electrodes of each rod are arranged in each case on the narrow sides and one long side, with the electrodes on the long side being preferably not more half as wide as the electrodes on the narrow sides. In addition, the electrodes of each adjacent side surface are connected with one another around the outer edge. The right-angled rods are arranged one after another by length, with their narrow sides in each case forming a long side of the receiver matrix. One of these long sides is provided with the ultrasonic-sensitive layer. The long side of the ultrasonic-sensitive layer, which faces away from the receiver matrix is provided with a flat electrode. In this way an especially sensitive ultrasonic receiver matrix is obained, and any desired matrix form—in other words, an n×n or an n×m matrix—can be assembled. In addition, the length of each rod can be chosen arbitrarily, so that the image plane can be made as large as desired.

In another embodiment of the device, the receiver matrix contains a photosensitive layer—made for example of silicon—and several right angle rods, each of which is provided with electrodes. In addition, square rods can also be used. By this means, a device is obtained which converts a two-dimensional light pattern into a two-dimensional charge pattern and reads it out in parallel.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
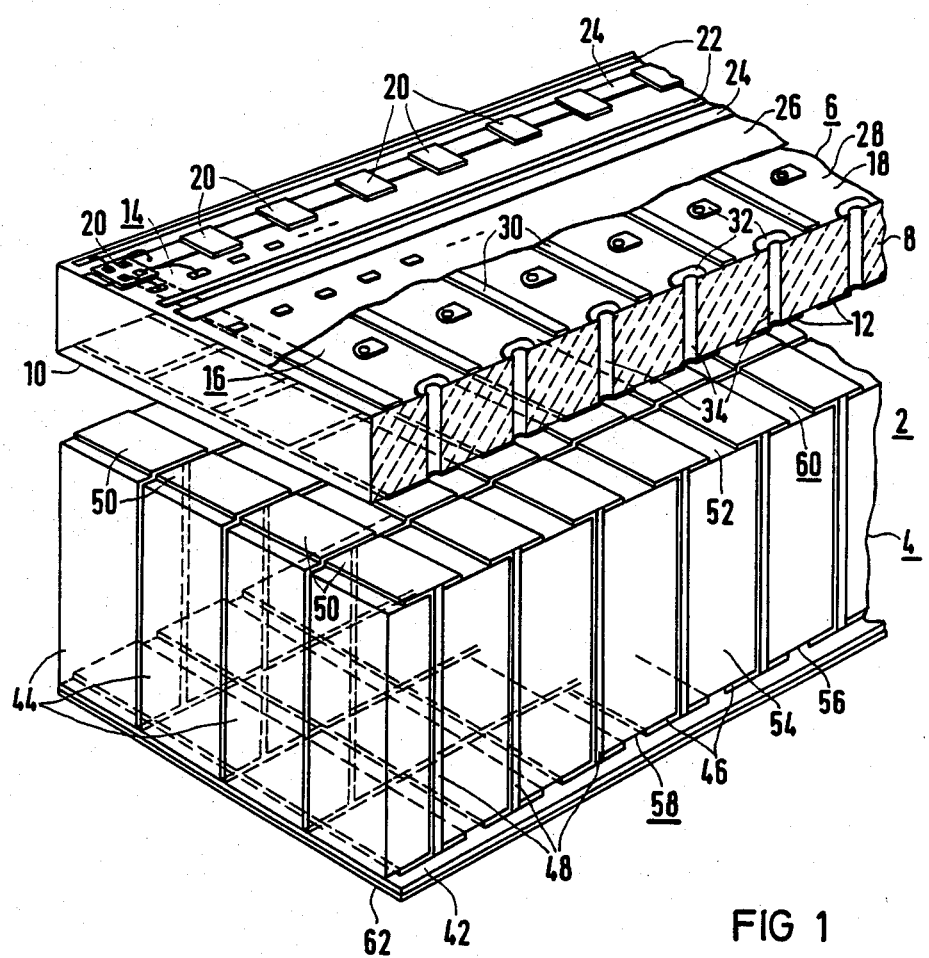
FIG. 1 shows a preferred embodiment of the invention.

In the embodiment shown in FIG. 1, a device for reading out a two-dimensional charge pattern by means of an array 2 includes a receiver matrix 4 and a switching matrix 6. This switching matrix 6 consists of a carrier plate 8, which is parallel to an image plane and may have the dimensions of an image that is to be read out. In certain circumstances, the carrier plate 8 may also consist of several (perhaps four) component plates. The carrier plate 8 is made of etchable glass with an area of perhaps 20×20 cm and a thickness of perhaps 1 mm. The long side 10 of the carrier plate 8, which faces the receiver matrix 4, is provided with n×n or n×m electrodes 12, which are arranged in rows 14 and columns 16. This matrix, which might consist of 128×128—but preferably of 256×256—electrodes 12, has a grid dimension that is smaller than or equal to twice the maximum reciprocal spatial frequency of the image to be presented. In the case of an ultrasonic image with a spatial frequency of 0.5 1/mm, the resulting grid dimension might, for example, be 1 mm. On the long side 18 of the carrier plate 8, which faces away from the receiver matrix 4, are provided a number—for example, 128×128, but preferably 256×256—of switchable amplifiers 20 in chip form. In addition, the long side 18 of the carrier plate 8 is provided with signal output lines 22 and ground lines 24, which are introduced on an isolating layer 26, for example, a silicon oxide layer. Between this isolating layer 26 and the surface 28 of the carrier plate, which faces it, are arranged control lines 30 and contact lips 32. The isolating layer 26 is provided with windows above the contact lips 32 and *) sections of the control lines 30. These signal output lines 22, control lines 30, ground lines 24 and contact lips 32 are produced by means of thin-film technology on the long side 18 of the carrier plate 8. The switchable amplifiers 20 and the contact lips 32 are each positioned to lie in geometrical shadows of the electrode 12 on the long sides 10. Each contact lip 32 is electrically connected in each case through a hole 34 with an electrode 12. To accomplish this, the surface of the hole 34 is provided with a conducting material. The signal output lines 22 and the control lines 30 are arranged in rows 14 and columns 16, in which case the ground lines 24 might run parallel to the signal output lines 22. The switchable amplifiers 20 are arranged in rows 14 and columns 16, inasmuch as they are placed on the ground lines 24. In this embodiment, dual-gate MOSFETS are used as the switchable amplifiers 20, but MOSFETS with only one gate electrode, or bipolar transistors can also be used. A leak resistance is provided for each switchable amplifier 20 and is integrated in the amplifier chip.

(*) above certain

The receiver matrix 4 of the array 2 contains an ultrasound-sensitive layer 42 and a number of right-angled rods 44, each of which is provided with electrodes 46, 48, 50. A film made of polyvinylidene fluoride (PVDF) is used as the layer 42. Alternatively, a piezoceramic layer may be used as the layer 42. In certain circumstances, it may be advantageous if the receiver matrix 4 contains a photosensitive layer, for example, silicon, or square rods. The rods 44 are provided in each case as a hard backing for the layer 42*). The electrodes 46, 50 are arranged on the respective narrow sides 56, 52, of the various rods, and the electrodes 48 on the long side 54. In addition, the electrodes 46, 48, 50 on adjacent side surfaces are connected with one another around an outer edge. The electrodes 48 of the long side 54 of each rod 44 are preferably half as wide as each of the electrodes 46 and 50 on the narrow sides 56 and 52 of each rod 44. In addition, the electrodes 46 and 50, which are arranged respectively on the narrow sides 56 and 52, are at a distance from the outer edge of the long side adjacent to the long side 54, so that the electrodes 46 or 50 of adjacent rods 44 are not electrically connected. In addition, these electrodes 46 and 50 have the same grid dimension as the electrodes 12 of the switching matrix 6—for example, 1 mm when the spatial frequency of the ultrasonic image is 0.5 1/mm. These right-angled rods 44 are arranged by length one after the other, with their narrow sides 56 and 52 forming respectively the long sides 58 and 60 of the receiver matrix 4. The length of each rod 44 and the respective number of electrodes 46, 48, 50 is determined by the predetermined form of the matrix, which might be n×n or n×m. For example, in the case of a 128×128 (preferably 256×256) matrix, 128 (or 256) right-angled rods 44 form the long sides 58 and 60 of the receiver matrix 4, with each rod 44 being provided with 128 (or 256) electrodes 46, 48 and 50. The long side 58 of the receiver matrix 4 which faces away from the switching matrix 6 is provided with the layer 42. In addition, the long side of the layer 42, which faces the image plane, is provided with a flat electrode 62. The layer 42 is polarized in the direction of its thickness. The respective areas that lie between the matrix of electrodes 46 and the electrode 62 thus constitute elementary transducers. With the aid of an anisotropically conducting material or a material with a high relative dielectric constant—for example, between 5 and 10—the switching matrix 6 is mated with the receiver matrix 4 in such a manner that the electrodes 12 of the switching matrix 6 are located in geometric shadows of the elementary transducers. As the anisotropically conducting material, a plate is provided which has a high conductivity perpendicular to the plate plane and a low conductivity parallel to the plate plane. Thus the signals from the elementary transducers travel galvanically from the electrodes 50 to the electrodes 12. In the case of a plate *) In addition, the switching matrix 6 can easily be separated from the receiver matrix 4, and both components can be exchanged.

(*) in the case of PDVF as the sensitive layer
(*) consisting of a material with a high dielectric constant, the electrodes 50 and the electrodes 12 are capacitively connected.

This design makes it possible to increase sensitivity and bandwidth. In addition, the switchable amplifiers 20 remain accessible after the device has been assembled, so that when individual image points or entire lines drop out, the corresponding switchable amplifiers 20 can be exchanged. This device can be easily manufactured, inasmuch as all the switchable amplifiers 20 can be bonded in one process step. As a result of the standardization of the elements of the device, its manufacture, assembly and maintenance have been substantially simplified.

Figure 2:
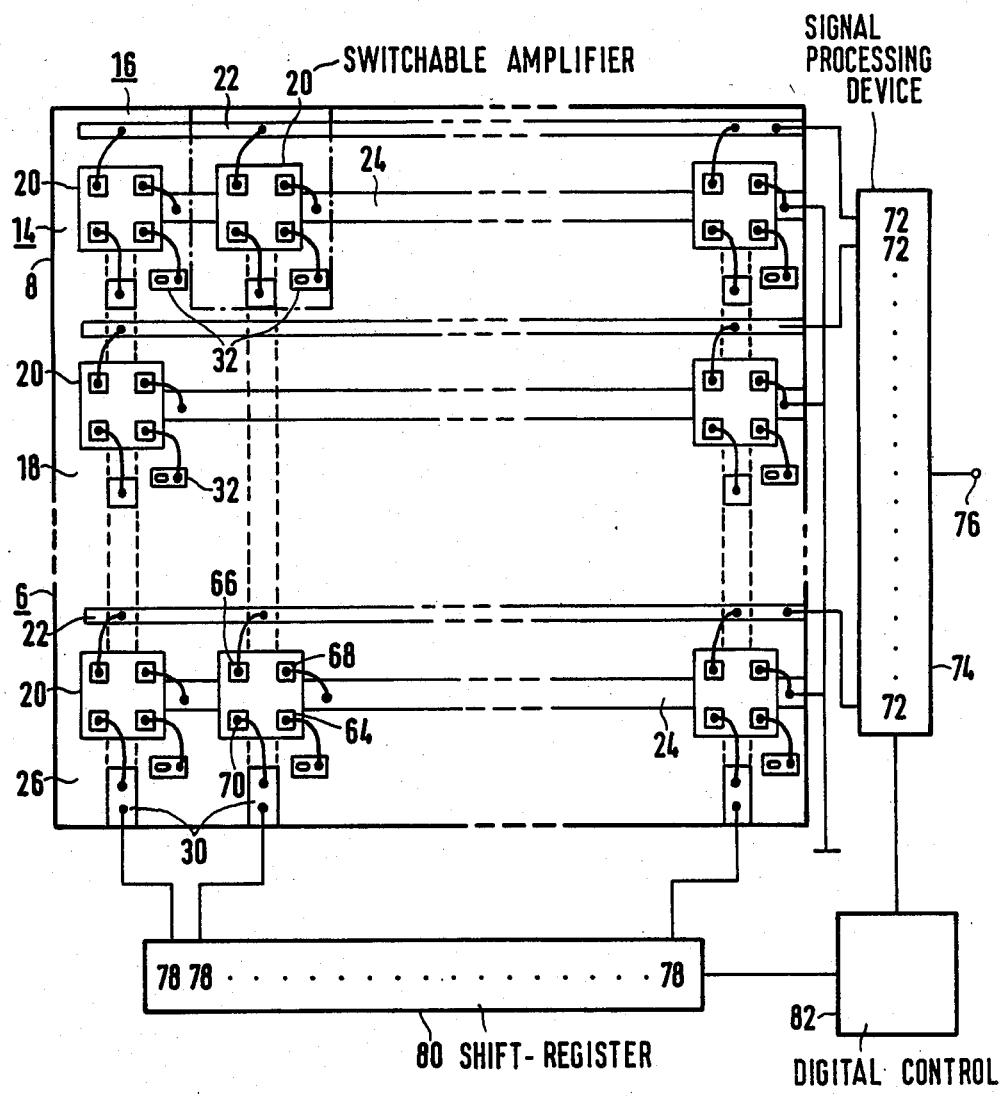
FIG. 2 shows a top view of a long side of the preferred embodiment which faces away from the receiver matrix.

FIG. 2 shows a top view of the long side of the carrier plate 8 of the switching matrix 6 which faces away from the receiver matrix 4. The switchable amplifiers 20 are arranged in rows 14 and columns 16. In addition, the signal output lines 22 and the ground lines 24 are arranged in rows 14. In this embodiment, dual-gate MOSFETs with an integrated leak resistance at the first gate 64 are used as the switchable amplifiers 20. Each switchable amplifier 20 is arranged on a ground line 24. Windows are provided in the oxide layer 26, to permit access to the control lines 30, which are arranged in columns 16, and to the contact lips 32. Each of the first gates 64 of the dual-gate MOSFETs is connected to a contact lip 32. Each of the drain pads 66 and each of the source pads 68 of the dual-gate MOSFETs in a row 14 is connected with a signal output line 22 and a ground line 24. Each of the second gates 70 of the dual-gate MOSFETs in a column 16 is connected to a control line 30. Bonding wires are used as connecting lines. The bonding wires between the contact lips 32 and the corresponding first gates 64 are in each case approximately the same length. The signal output lines 22—of which there may be 128, but preferably 256—are each connected to an input 72 of a signal-processing device 74, which might consist of a rectifier, an integrator, a sample and hold and a 128:1 or 256:1 multiplexer, none of which are shown in the drawing. At the output 76 of this signal processing device 74 the video signal is picked up serially. In addition, each of the 128 (or preferably 256) control lines 30 is connected to an output 78 of a 128-bit (or 256-bit) shift register 80. The signal-processing device 74 and the shift register 80 are controlled by a digital control 82, When the switching matrix 6 is designed in this manner, it becomes possible to read out a matrix, which might be 128×128, but is preferably 256×256, and which contains a charge pattern, in columns; in other words 128 (or 256) signals are read out in parallel and transmitted serially at the output 76 with the aid of the signal-processing device 74. By means of this parallel readout of a charge pattern, the signal/noise ratio is improved by a factor n, n being equal to 128 (or 256). In addition, a homogeneous signal amplification is obtained, since a switchable amplifier 20 is assigned to every elementary transducer and the connecting lines between each of the first gates 64 of the dual-gate MOSFETs and the respective contact lip 32 are approximately the same length. The use of this device for the readout of a two-dimensional charge pattern in an ultrasonic camera significantly increases the image quality. In addition, charge patterns can be presented in real time with high resolution and sensitivity.

Those skilled in the art will understand that changes can be made in the preferred embodiments here described, and that these embodiments can be used for other purposes. Such changes and uses are within the scope of the invention, which is limited only by the claims which follow.

What is claimed is:

1. A device for reading out a two-dimensional charge pattern, comprising:
   a receiver matrix comprising a plurality of elementary transducers arranged in orthogonal rows and columns;
   a rectangular carrier plate with two long sides and two short sides and having holes which pass through it;
   electrodes which are provided on a long side of the carrier plate which faces toward the receiver matrix and which are arranged in orthagonal rows and columns; and
   a switching matrix comprising a plurality of switchable amplifiers in chip form and arranged in orthogonal rows and columns on a long side of the carrier plate which faces away from the receiver matrix, a switchable amplifier being associated with each elementary transducer and being connected to a contact lip by a connecting line, the electrodes being connected to the contact lips by electrically conductive material provided on surfaces of said holes with all connecting lines being of approximately equal length.

2. The device of claim 1, wherein each switchable amplifier comprises a dual gate MOSFET and a leak resistance integrated in the same chip.

3. The device of claim 1, wherein the carrier plate comprises etchable glass.

4. The device of claim 2, wherein the connecting lines connect a first gate of each MOSFET to a corresponding contact lip and a second gate to a control line, and where the drain of each MOSFET is connected to a signal output line.

5. The device of claim 4, wherein the signal output lines are parallel to ground lines and perpendicular to control lines.

6. The device of claim 1, wherein the receiver matrix comprises a layer which is sensitive to ultrasound waves, and rectangular rods, each rod being provided with electrodes.

7. The device of claim 6, wherein said layer is polyvinylidene fluoride.

8. The device of claim 7, wherein the rods form a hard backing for said layer.

9. The device of claim 6, wherein the electrodes are located on two narrow sides and one long side of each rod, and wherein electrodes on adjacent side surfaces are connected together around an outer edge.

10. The device of claim 6, wherein the rods have narrow sides which form both long sides of the receiver matrix.

11. The device of claim 6, wherein the receiver matrix has one long side which faces away from the switching matrix and which support, said layer, and wherein said layer has a flat electrode facing away from the receiving matrix.

12. The device of claim 1, wherein the receiver matrix comprises a photosensitive layer of silicon and a plurality of rods, each rod being provided with electrodes.

13. The device of claim 1, wherein the switching matrix and receiving matrix are connected together by a dielectric material.

14. The device of claim 1, wherein the switching matrix and receiving matrix are connected together by a anisotropic conductor.

15. The device of claim 1, wherein there are grids of electrodes on the switching and receiver matrices which have like dimensions.

* * * * *